United States Patent [19]

Williams

[11] Patent Number: 4,972,356

[45] Date of Patent: Nov. 20, 1990

[54] SYSTOLIC IIR DECIMATION FILTER

[75] Inventor: Tim A. Williams, Austin, Tex.

[73] Assignee: Motorola, Inc., Schaumburg, Ill.

[21] Appl. No.: 345,855

[22] Filed: May 1, 1989

[51] Int. Cl.[5] ............................................. G06F 15/31
[52] U.S. Cl. .............................. 364/724.1; 364/724.17
[58] Field of Search ........................ 364/724.01–724.03, 364/724.1, 724.17

[56] References Cited

U.S. PATENT DOCUMENTS

| | | | |
|---|---|---|---|
| 4,104,729 | 8/1978 | Gingell | 364/724.17 |
| 4,185,325 | 1/1980 | Appell | 364/724.17 |
| 4,782,324 | 11/1988 | Underwood | 364/724.1 |
| 4,896,285 | 1/1990 | Ishikawa et al. | 364/724.01 |

Primary Examiner—Dale M. Shaw

[57] ABSTRACT

A systolic IIR decimation filter for use with an oversampled A/D converter. The filter includes a pole section having coefficients selected to generate complex pole pairs positioned to shape the filter output. A full multiplication of the coefficients is decomposed into an equivalent number of digital shifts and adds in accordance with a modified Booth's algorithm. The filter further includes a zero section for cancelling unwanted pole pairs produced by the decomposition and delays required for systolic operation. At least portions of the pole section are utilized in the zero section during times when redundant information is present in order to reduce equipment and provide decimation.

11 Claims, 9 Drawing Sheets

| X(n) | 1 | 2 | 3 | 4 | 5 | 6 | 7 |
|---|---|---|---|---|---|---|---|
| x1 | x1 | | | | | | |
| x1 | x1 | x1 | | | | | |
| x2 | x2 | x1 | x1 | a2x1 | | | |
| x2 | x2 | x2 | x1 | a2x1 | a2x1 | a2x1+ a1x2 | |
| x3 | x3 + a2x1 + a1x2 | x2 | x2 | a2x2 | a2x1 | a2x1+ a1x2 | a2x1+ a1x2 |
| x3 | x3 + a2x1 + a1x2 | | x2 | a2x2 | a2x2 | a2x2+ a1x3 | a2x1+ a1x2 |
| x4 | x4 + a2x2 + a1x3 | | | | a2x2 | a2x2+ a1x3 | a2x2+ a1x3 |
| x4 | x4 + a2x2 + a1x3 | | | | | | a2x2+ a1x3 |

| X(n) | 1 | 2 | 3 | 4 | 5 | 6 | 7 |
|---|---|---|---|---|---|---|---|
| x1 | x1 | | | | | | |
| x1 | x1 | x1 | | | | | |
| x2 | x2 | x1* | x1 | a2x1 | | | |
| x2 | x2 | x2 | x1* | b1x1* | a2x1 | a2x1+a1x2 | |
| x3 | x3+a2x1+a1x2 | x2* | x2 | a2x2 | b1x1* | b1x1*+b0x2 | a2x1+a1x2 |
| x3 | x3+a2x1+a1x2 | x3 | x2* | b1x2* | a2x2 | a2x2+a1x3 | b1x1*+b0x2 |
| x4 | x4+a2x2+a1x3 | x3* | x3 | a2x3 | b1x2* | b1x2*+b0x3 | a2x2+a1x3 |
| x4 | x4+a2x2+a1x3 | x4 | x3* | b1x3* | a2x3 | a2x3+a1x4 | b1x2*+b0x3 |

SYSTOLIC IIR DECIMATION FILTER

TECHNICAL FIELD

The present invention pertains to a systollic decimation filter and more particularly to a systollic decimation filter including a single infinite impulse response (IIR) structure.

BACKGROUND OF THE INVENTION

It is well known in the art to oversample analog signals in A/D converters so that sampling and other types of noise are spread over a greater spectrum and are, therefore, greatly reduced in the band of interest, i.e. in the band of the desired signal. The noise can then be substantially eliminated by passing the oversampled signals through a low pass digital filter. The use of oversampled A/D converter techniques is a practical method of obtaining both high resolution and high sampling rates from monolithic converters. Oversampled A/D converters are an important technique for commercial applications since the analog components are relatively easy to design and are insensitive to variations in performance caused by processing variations. The task of the digital filter is to attenuate the noise which is outside of the frequency band of interest while appropriately shaping the input signal. The digital filter can become very complicated because of the high sample rates used and the required shaping. In todays 1.5 uM CMOS technology sample rates can range from 1 MHz to 20 MHz. Thus, at some point in the digital filter a decimator is utilized to reduce the sample rates. A decimator is simply a device that removes redundant information. Previously reported decimation filters for oversampled A/D converters utilize the cascaded integrator comb (CIC) structure first described in "An Economical Class of Digital Filters for Decimation and Interpolation", by Hogenauer, E., *IEEE* ASSP-29 #2; April 1981; p. 155. If a specific spectral shape is desired, the CIC structure is usually run at a lower decimation factor and a finite impulse response (FIR) structure is added in cascaded to form a two stage filter. These constraints greatly restrict the CIC structure in terms of spectral shaping and, in addition, the CIC and FIR structure are relatively complicated to design and construct.

SUMMARY OF THE INVENTION

It is an object of the present invention to provide a new and improved systolic IIR decimation filter.

It is a further object of the present invention to provide a new and improved systolic IIR decimation filter that is more efficiently implemented and is less restrictive in terms of spectral shaping constraints than prior art structures.

It is a further object of the present invention to provide a new and improved systolic IIR decimation filter that uses a minimum of components and which can be efficiently implemented even under high decimation factors.

These and other objects are realized in a systolic IIR decimation filter including a pole section in which an oversampled A/D converter signal is systolicly multiplied by a plurality of coefficients selected to generate a complex pole pair to shape the filter output. At least one of the coefficients is decomposed into a plurality of digital shifts and adds to simplify the multiplication process. The decomposition may be in accordance with Booth's algorithm to reduce the number of extra delays and, hence, the number of unwanted pole pairs generated. A zero section is connected to the pole section and generates zeros which can be positioned to cancel unwanted pole pairs. The zero section is constructed, at least partially, from components of the pole section which are time shared during periods when redundant information would normally be processed in the pole section. As an option, to reduce the required precision of the IIR coefficients for high decimation factors, the origin of the Z plane is redefined in the pole section coefficients using an Agarwal and Burris transform.

BRIEF DESCRIPTION OF THE DRAWINGS

Referring to the drawings, wherein like characters indicate like parts throughout the FIGS..

DESCRIPTION OF THE PREFERRED EMBODIMENT

Figure 1:
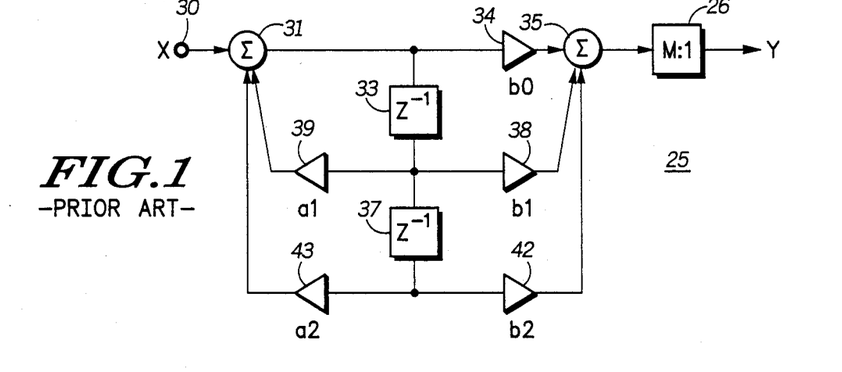
FIG. 1 is a block diagram of a known second order IIR filter with a cascaded M:1 decimator, where M is an integer.

Referring specifically to FIG. 1, a conventional second order IIR filter 25 with cascaded M:1 decimator 26 is illustrated in block form, which filter 25 has a transfer function described by the equation:

$$H(Z) = \frac{b0 + b1D + b2D2}{1 + a1D + a2D2} \quad (1)$$

where: $D = Z^{-1}$ = one delay
$D2$ = two delays.

Filter 25 includes an input terminal 30, adapted to receive an input signal from an oversampled A/D converter or the like, connected to one input of a summing device 31. An output of summing device 31 is connected to the input of a first delay circuit 33 and to the input of a multiplier 34. Multiplier 34 multiplies the signals applied to the input thereof by the coefficient b0. The output, or product, of multiplier 34 is applied to an input of a second summing device 35. The output of delay circuit 33 is applied to an input of a second delay circuit 37 and the inputs of multipliers 38 and 39. Multiplier 38 incorporates a coefficient b1 and multiplier 39 uses a coefficient a1. The output of delay circuit 37 is applied to inputs of multipliers 42 and 43, which multiply the input signals by coefficients b2 and a2, respectively. The outputs of multipliers 39 and 43 are summed with the input signal from terminal 10 in summing device 31 and the outputs of multipliers 34, 38 and 42 are all summed in summing device 35 and applied to the input of decimator 26.

Figure 2:
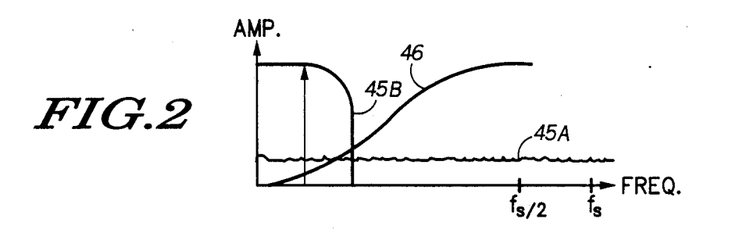
FIG. 2 is a graphical representation of a typical oversampled A/D converter output signal with the frequency response of the filter of FIG. 1 imposed thereon.

Referring to FIG. 2, a typical output signal, designated 46, from an oversampled A/D converter is illustrated graphically. The portion of the signal designated 45B is the band of interest which includes the oversampled analog signal and the portion of the signal designated 46, which represents noise produced by oversampling, etc. Since the power of the noise is relatively constant, by oversampling or spreading the noise across a very wide band the amplitude of the noise is substantially reduced relative to a portion of the signal designated 45A. Filter 25, with a frequency response curve as depicted by signal 45B, is constructed to remove all of the noise outside of the band of interest and the frequency response curve is shaped to have as small an effect on the band of interest as is practically possible.

Figure 3:
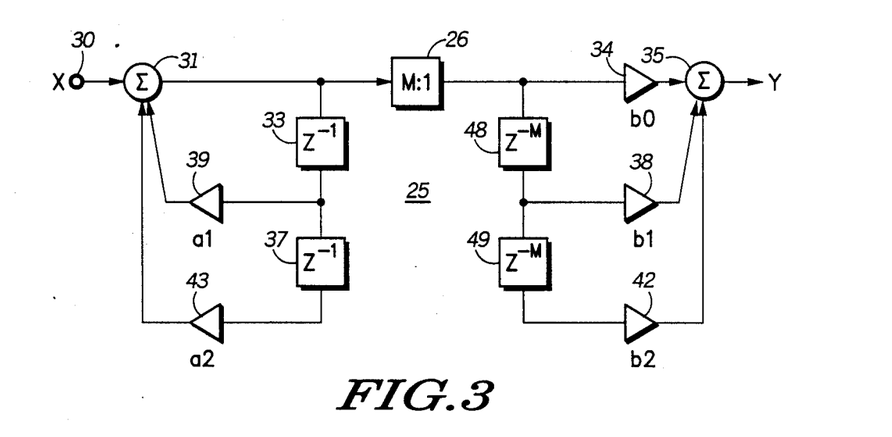
FIG. 3 is a block diagram of the FIG. 1 filter with the components rearranged using the commutative properties of decimation so that the pole and zero sections are separated by the decimator.
Figure 4:
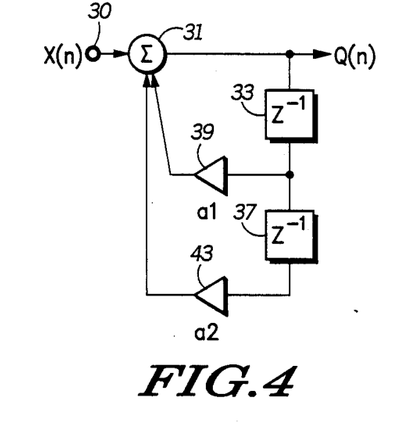
FIGS. 4, 5, 6 and 7 are each block diagrams illustrating equivalent forms of the pole section of the filter illustrated in FIG. 3.
Figure 5:
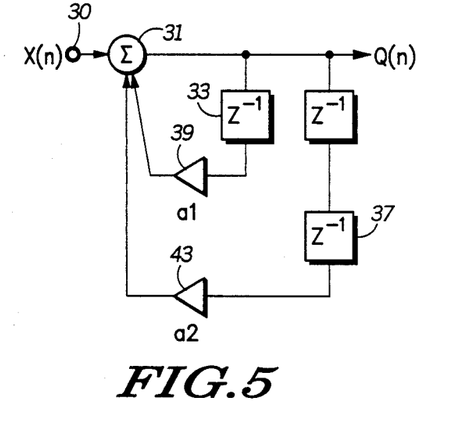
Figure 6:
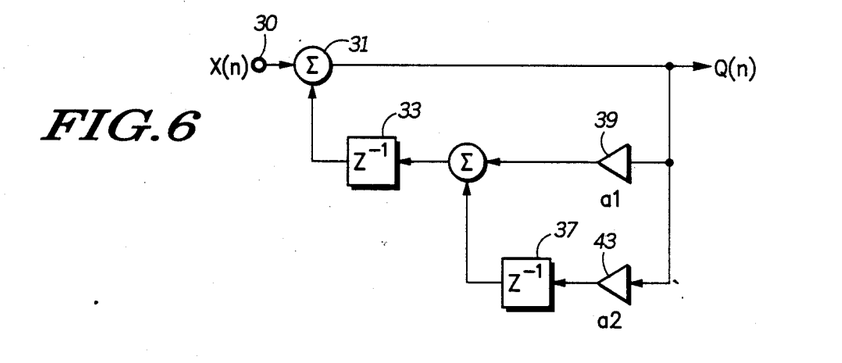

Referring to FIG. 3, by utilizing the comutative properties of decimation the components of filter 25 in FIG. 1 can be rearranged as illustrated. In this structure the relationship of summing device 31, delay circuits 33 and 37, and multipliers 39 and 43 are the same as in FIG. 1. These components form the pole section of the filter 25 and generate a complex pole pair, which shape the frequency response of filter 25 rather than simply placing all of the poles and zeros on the Z axis. The output of the pole section is applied to decimator 26 so that the remainder of filter 25 can now operate at a much lower sample frequency. M is the decimation factor and can be any whole number desired. The remainder of filter 25 is the zero section and, instead of sharing delay circuits 33 and 37 (as in FIG. 1), two new delay circuits 48 and 49 are incorporated which have a delay M bits long instead of one bit long. Delays 33 and 37 are utilized in the pole section so that the filtering can be done systolicly, i.e. a continuous stream of digital bits can be applied to input terminal 30 and continuous filtering or pipelining occurs. However the incorporation of extra delays in the pole section produces unwanted pole pairs. Thus, the zero section is included to cancel unwanted pole pairs. By operating the zero section at the lower, or decimated, sample frequency, the structure can be greatly simplified.

Figure 7:
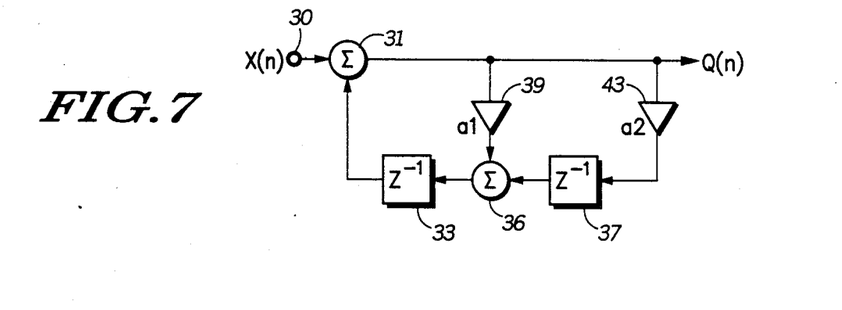

FIGS. 4 through 7 illustrate a series of rearrangements of the pole section of filter 25. In the final arrangement of FIG. 7, the input signal from terminal 30 is applied to an input of summing device 31, the output of which is applied to inputs of multipliers 39 and 43 and is the output of the pole section. The output of multiplier 43 is applied through delay circuit 37 to a second summing circuit 36, where the signal is summed with the output of multiplier 39. The output of summing circuit 36 is applied through delay circuit 33 to a second input of summing circuit 31, where it is summed with the input signal from terminal 30. It should be noted that this recursive structure operates at the sample rate of the input data bit stream coming from the A/D converter. In todays 1.5 uM CMOS technology, the data bit stream can be in the range of 1 MHz to 20 MHz. To implement the two multiplies (multipliers 39 and 43) required for a single complex pole pair in a fully parallel multiplier at a 20 MHz rate would take a great deal of silicon. One simplification is to restrict the values of the coefficients to the form of $a = 2^i$, where i is a negative integer. In the present case, the coefficient, a1, could be implemented as:

$$a1 = (-2 + 2^i).$$

Figure 8:
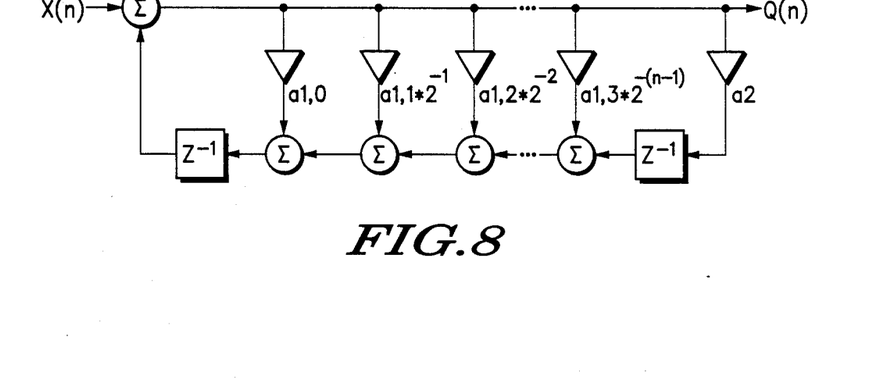
FIG. 8 is a block diagram of the pole section illustrated in FIG. 7 with one of the coefficient multiplications decomposed into n shift and add steps, where n is an integer.

Partitioning coefficient a1 (and a2 if desired) into a series of n binary weighted shifts and additions is illustrated in FIG. 8. This structure is not a problem to implement.

Figure 9:
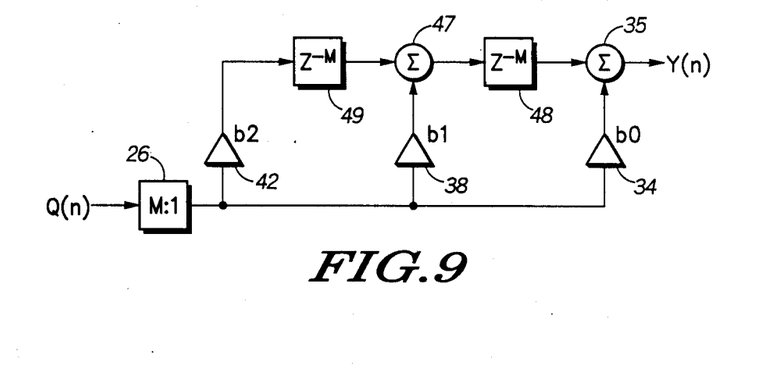
FIG. 9 is a block diagram of the zero section of the filter illustrated in FIG. 3 with the components rearranged.
Figure 10:
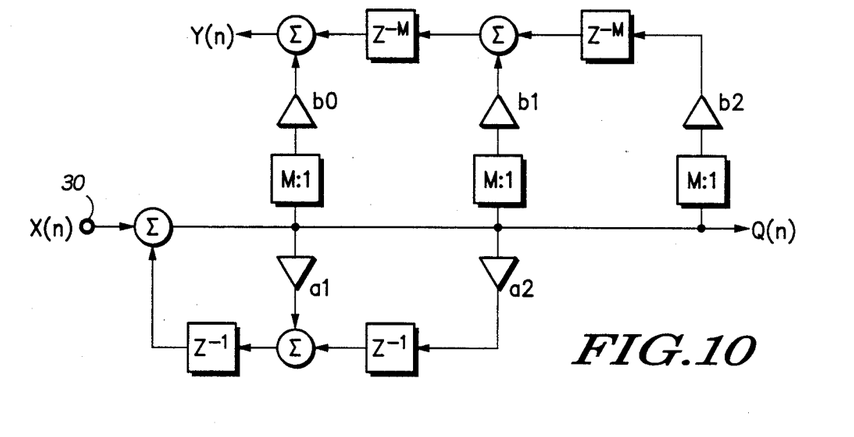
FIG. 10 is a block diagram of the pole section from FIG. 7 and the zero section from FIG. 9 combined into a pole-zero decimator filter.
Figure 11:
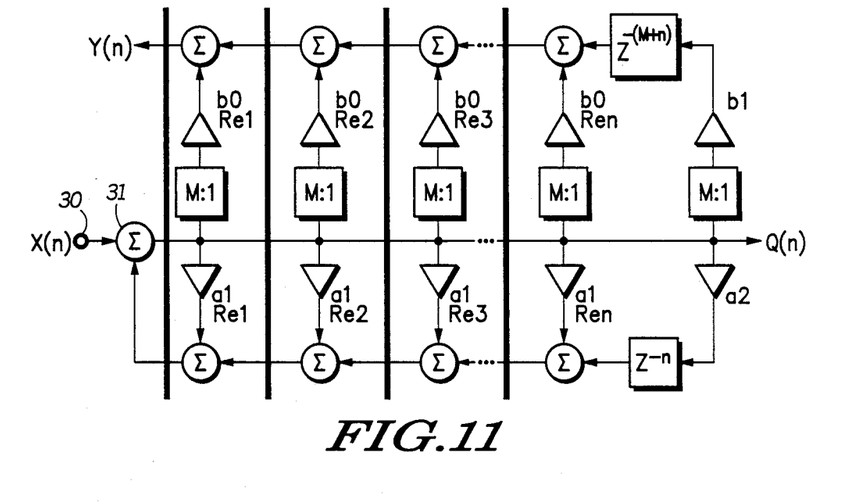
FIG. 11 is a block diagram of the filter of FIG. 10 with one coefficient in the pole section and one coefficient in the zero section decomposed and recoded according to Booth's algorithm.
Figure 12:
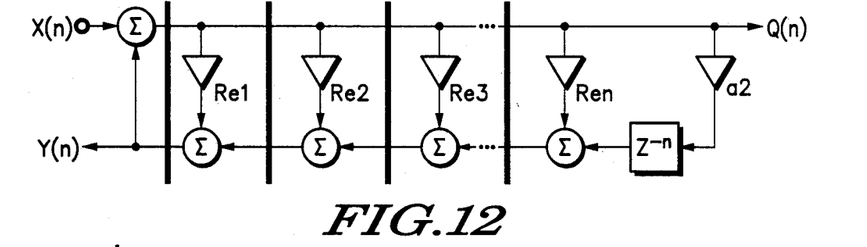
FIG. 12 is a block diagram of the filter of FIG. 11 with the pole section and zero section combined into a single time shared section.

The zero section is rearranged, as illustrated in FIG. 9 so that the decimated output of the pole section is applied to the inputs of multipliers 42, 38, and 34. The output of multiplier 42 is delayed in delay circuit 49 and summed with the output of multiplier 38 in summing device 47. The output of summing device 47 is delayed in delay circuit 48 and summed with the output of multiplier 34 in summing device 35, the output of which is the output of the structure. By decimating the input to each of the multipliers 42, 38 and 34 and combining the circuit with the pole section of FIG. 7, the structure of FIG. 10 is derived. Each of the coefficients can then be partitioned into a series of n binary weighted shifts and additions, as explained above. If the decomposition of the multiplies is done in accordance with Booth's algorithm, the number of additional delays required is minimized, and the required number of cancelling zeros is reduced. The structure of FIG. 10 recorded in accordance with Booth's algorithm is illustrated in FIG. 11. In this structure the pole section is operating at the input rate of the data at terminal 30 and the zero section is operating at same lower rate (1/M). Since the input data contains redundant information, the pole section can be time division multiplexed, or time shared, so as to operate as the zero section during periods of redundant information. This time sharing is illustrated in FIG. 12. By time sharing at least some of the hardware the overall size and cost of the structure can be substantially reduced.

Figure 13:
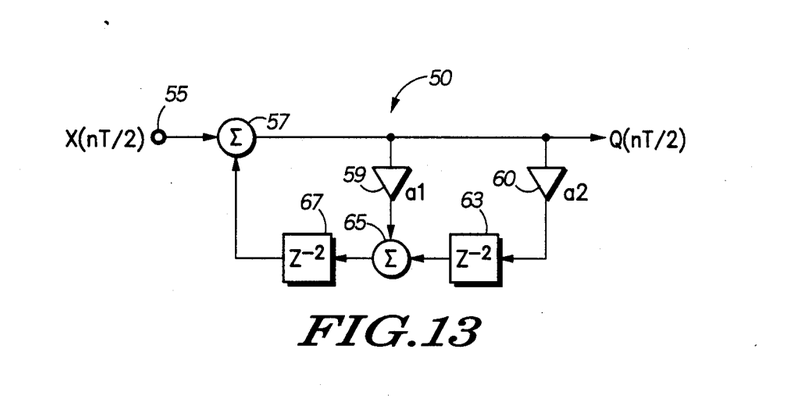
FIG. 13 is a block diagram of a pole section equivalent to the pole section of FIG. 7 with the input signal redefined.

When the A/D converter is operating at high speeds, generally speeds comparable to the carry propagation time of a single adder, a somewhat different filter is used, the pole section 50 of which is illustrated in FIGS. 13 through 16. Pole section 50, as illustrated in FIG. 13, has basically the same arrangement of components as the pole section of filter 25 illustrated in FIG. 7. In this embodiment input terminal 55 supplies an input signal to a summing device 57, which supplies the sum signal to multipliers 59 and 60 and as the output of the pole section. Multiplier 60 multiplies the applied signal by the coefficient a2 and supplies the product through a delay circuit 63 to a second summing device 65. Multiplier 59 multiplies the applied signal by the coefficient a1 and supplies the product to summing device 65, which sums the two products and supplies them through a delay circuit 67 to the summing device 57. It should be noted that the relationship of the delay circuits 63 and 67 to the input signal has been changed. Essentially, the input rate has been doubled so that each one bit delay circuit is now equivalent to the delay of the previously described embodiments. The number T/2 was selected only for purposes of this explanation and it will be understood that any convenient number might be utilized, with the length of a one bit delay decreasing as the information rate increases.

Figure 14:
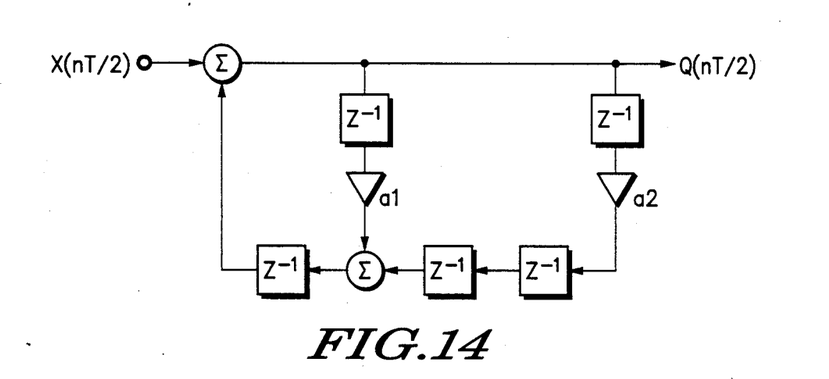
FIGS. 14, 15 and 16 are block diagrams of the filter of FIG. 13 with the components rearranged.
Figure 15:
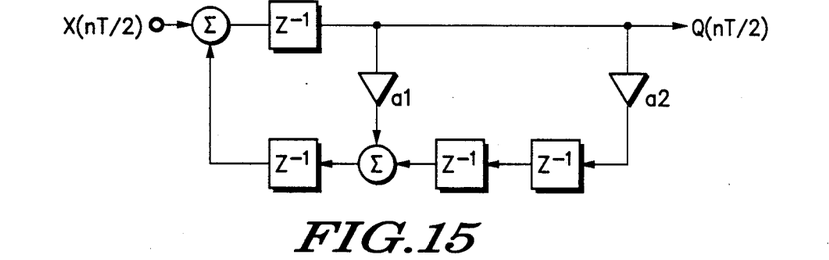
Figure 16:
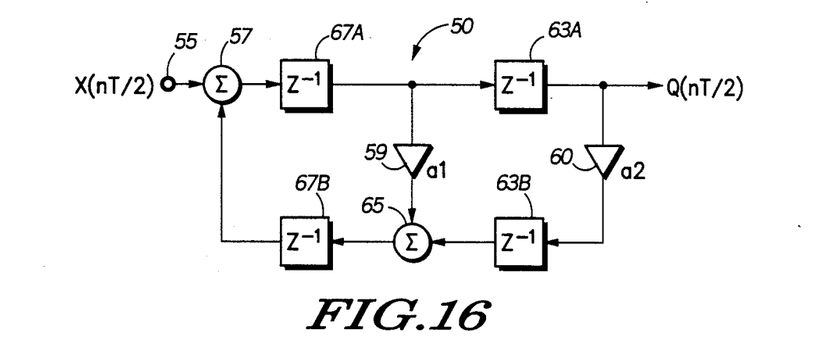

Since each of delay circuits 63 and 67 is a two bit delay, the circuits can be broken up into two one bit delays as illustrated in FIGS. 14 through 16. In the final configuration, illustrated in FIG. 16, delay circuits 63 and 67 are each divided into two one-bit delays 63A/63B and 67A/67B and a one-bit delay is positioned on each side of multipliers 59 and 60. The transfer function for this embodiment is given by:

$$H(Z) = (1 - a1*Z^{-N} - a2*Z^{-2N})^{-1} \quad (2)$$

where N equals two in the illustrated form.
If
a1 = 2r cos ($\phi$) and
a2 = $-r^2$,
this transfer function has poles at $$Z = re^{\pm j(N\phi + 2k)N} \quad (3)$$

for k = 0, 1, 2 ... N−1, if the data supplied to input terminal 55 is presented at the highest sample rate. Thus, the pole sector now performs the equivalent of a single full precision multiply at the fastest sample rate, instead of two multiplies as in the previously described embodiment. However, even a single multiply at the highest bit rates can be a problem. To solve this problem, the multiplies are decomposed into a series of shifts and additions.

Figure 17:
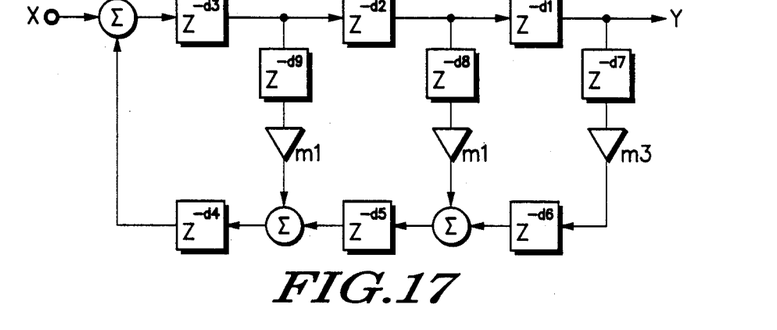
FIG. 17 is a block diagram of a general delay architecture wherein one of the coefficients of the structure of FIG. 16 has been decomposed into three operations.

Referring to FIG. 17, a general delay architecture is illustrated where the systolic cell, including a delay circuits 67A/67B and multiplier 59 (a1 coefficient), is decomposed into a series of three operations. The transfer function for the structure of FIG. 17 is $$y = x - \\ + y[m1Z^{-(d3+d4+d9)} + m2Z^{-(d2+d3+d4+d5+d8)} + m3Z^{-(d1+d2+d3+d4+d5+d6+d7)}] \quad (4)$$

Figure 18:
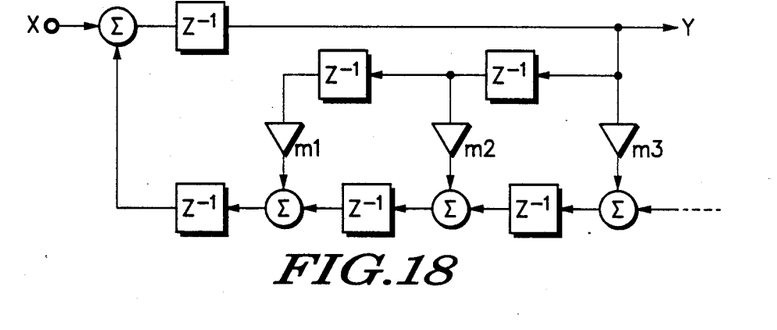
FIG. 18 is a block diagram of the structure of FIG. 17 incorporating specific delay values.
Figure 19:
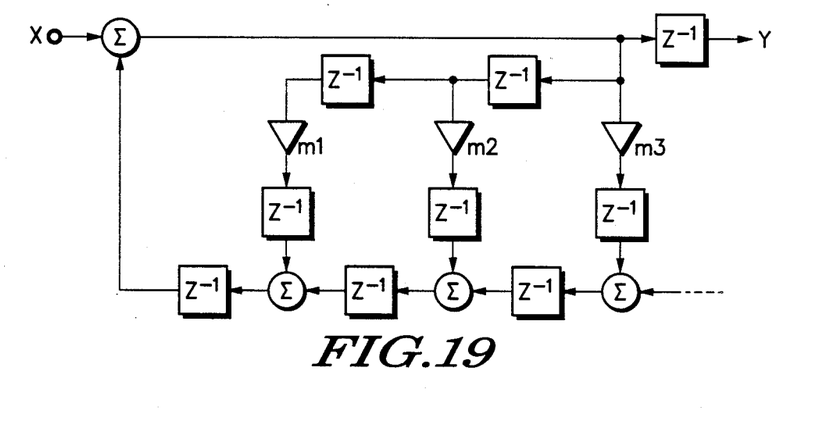
FIG. 19 is a block diagram similar to FIG. 18 wherein a modified Booth's algorithm is incorporated.

For the propagation of data around the structure to be properly timed in order to implement equation two, the following relationships mut be true: $d9 = d9 + d5 + d8 = d1 + d2 + d5 + d6 + d7$. Choosing $d5 = d6 = 1$ allows for pipelining of the additions. Also, selecting $d1 = d2 = 0$ yields, $d9 = 1 + d8 = 2 + d7$. Setting $d7 = 0$ shows that $d8 = 1$, while $d9 = 2$. FIG. 18 illustrates the structural results of choosing these delay values. Note that this decomposition has increased the total number of delays around each loop by two. The cost of decomposing the multiplications in this fashion is the additional delay which adds more unwanted pole pairs to the transfer function. These pole pairs must be removed because they will allow portions of the shaped noise to be aliased into the passband after decimation. These unwanted pole pairs must then be eliminated by placing zeros in such a manner as to cancel the effect of the unwanted poles. It should be noted that the multiplications in the zero section can also be decomposed into any number of systolic elements without affecting the transfer function. Only the latency of the filter is increased by the decomposition of the zero section.

In the implementation illustrated in FIG. 18, each operation of the decomposed multiply step adds an unwanted delay inside the recursion loop and causes a new unwanted pole pair to be generated. Thus it is advantageous to reduce the number of delays introduced by the decomposition to a minimum. This can be accomplished by using high radix Booth's algorithm recoding. The standard Booth's algorithm recodes 2 bits at a time. The modified Booth's algorithm recodes 3 bits at a time and requires that the input be multiplied by one of the five timers: 0, +1, +2, then added to the partial product. Since this recoding scheme uses three bits at a time, it will require only N/2 additional delays when N is even and (N+1)/2 delays when N is odd. In FIG. 18, the recoding of the first three bits will determine m1, which will multiply the input by 0, +1, or +2 depending upon the value of the coefficient for those three bits. This is easily accomplished using only multiplexors to select 0, 1x, or 2x and then controlling the add/subtract input to the subsequent summing circuit to implement the required addition or subtraction.

Booth's algorithm is well known to those skilled in the art, however, any additional information that might be desired can be obtained from, for example, *Computer Arithmetic*, by Kai Hwang, published by John Wiley & Sons. It should be noted that, while there are several modifications of Booth's algorithm which allow groupings of multiplier bits of two or greater, the terms "Booth's algorithm" and "modified Booth's algorithm" may be used interchangeably in this description since the actual recoding scheme will be tailored to the needs of each individual case.

Figure 20A:
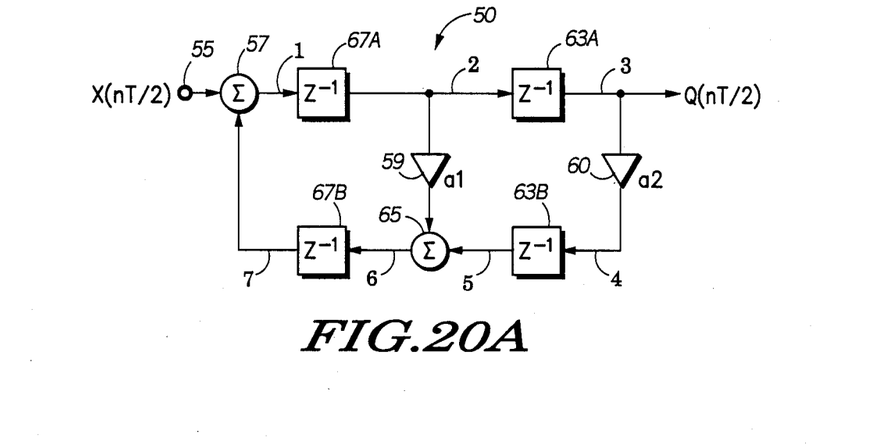
FIGS. 20A and 20B illustrate in block diagram and tabular form, respectively, computation of the poles from the pole section of FIG. 16.

Referring to FIGS. 20A, 20B, 21A and 21B, a more detailed description of the time division multiplexing, or tme sharing of hardware is illustrated and will be disclosed in conjunction therewith. FIG. 20A is the structure of FIG. 16 with seven different nodes designated to compare the progress of data therethrough. Node 1 is the signal appearing at the output of summing device 57, node 2 is the signal appearing at the inputs to delay circuit 63A and multiplier 59, node 3 is the signal appearing at the input to multiplier 60, node 4 is the signal appearing at the input to delay circuit 63B, node 5 is the signal appearing at the output of delay circuit 63B, node 6 is the signal appearing at the input to delay circuit 67B, and node 7 is the signal appearing at the output of delay circuit 67B. The chart of FIG. 20B lists the input signal appearing at terminal 55 in the first column and the signal simultaneously present at each of the seven nodes in the following seven columns. The eight rows, beginning at the top of the chart with "x1" and progressing downwardly, depict eight bits of information applied in the normal sequence to terminal 55. It can be seen from this chart that there are redundant bits of information being processed in pole section 50 of FIG. 20A. This is a consequence of the doubling of the rate, or halving of the delay times, as previously explained. Since the data is oversampled by the A/D converter, this manipulation has no actual effect on the data content being applied to input terminal 55.

Figure 20B:
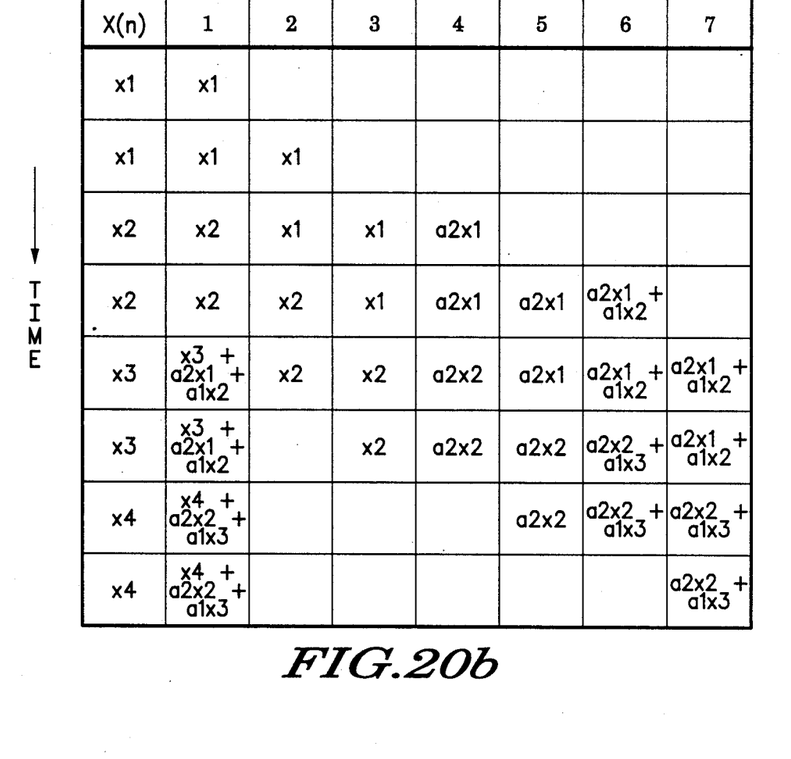
Figure 21A:
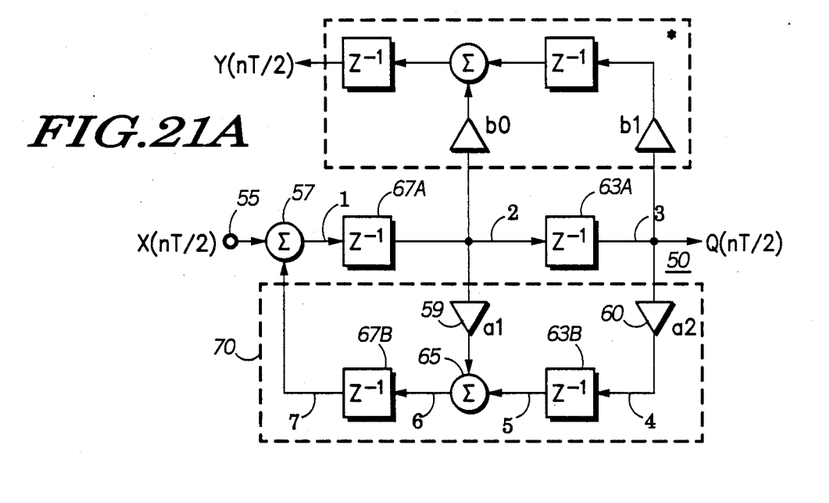
FIGS. 21A and 21B illustrate in block diagram and tabular form, respectively, incorporation of the zero section by time division multiplexing of the pole section.
Figure 21B:
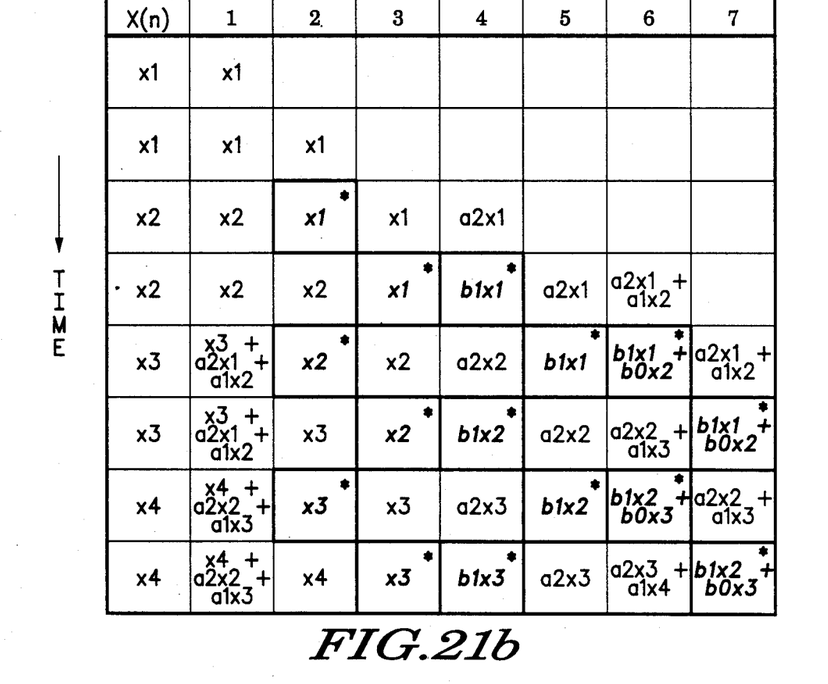

Referring specifically to FIG. 21B, a chart similar to the chart of FIG. 20B is illustrated in which the redundant bits of information are cross hatched so that the pattern can be easily determined. Similarly, in FIG. 21A a zero section has been added to pole section 50 and cross hatched to indicate that it will be operating during the cross hatched times in FIG. 21B. It should be noted that the cross hatched zero secton is really the portion of pole section 50 contained in broken lines 70. By a simple multiplex operation the components; multipliers 59 and 60, delay circuits 63B and 67B, and summing device 65, operate in conjunction with summing device 57 and delay circuits 67A and 63A as a pole section during the uncross hatched times of the chart in FIG. 21B and as a zero section during the cross hatched times. Thus the amount of hardware is substantially reduced and simplified and at least partial decimation is automatically incorporated. It will of course be understood by those skilled in the art that different amounts and types of hardware can be time shared by using this concept and the disclosed specific embodiment is only of purposes of explanation.

Throughout this description very small decimation factors, e.g. 2, have been described, but for practical A/D converters the decimation factors are usually on the order of 100. As the decimation factor increases the precision of the IIR coefficients becomes large because the poles move together and toward the unit circle at the $Z=1$ point. To solve this problem, the pole section is redefined in accordance with the Agarwal and Burrus transform. The Agarwal and Burrus transform can be incorporated without destroying the systolic nature of the described structures. This redefining of the pole section simple transforms the origin of the Z plane such that it is at $Z=1$. This redefining is accomplished by substituting $Z'=Z-1$ for Z in the transfer equation (2) of the pole section for the case where $N=1$, where $Z'$ is the new complex plane variable. Since $Z'=Z-1$, $Z=Z'+1$ and $$\frac{1}{Z} = \frac{1}{Z'+1} = \frac{Z'^{-1}}{1+Z'^{-1}} \quad (5)$$

Substituting D for (1/Z) provides the following $D=D'/(1+D')$.

$$H(Z) = \frac{1}{1 - a1D - a2D^2} \quad (6)$$

$$H(Z) = \frac{1}{1 - a1(D'/1 + D') - a2(D'/1 + D')^2} = \quad (7)$$

$$\frac{1}{1 + (2-a1)D' + (1-a1-a2)D'^2}$$

This is the Agarwal Burrus result and is a desirable format since $a1 = 2r \cos(o)$ and $a2 = -r^2$. As the decimation factor increases, $\cos(o)$ will approach 1 and $(2-a1)$ will approach zero. This format allows the coefficients to be implemented with a smaller precision. The extension of the Agarwal and Burrus transform to the situation in which N is not 1 in equation (2) uses the substitution.

$$Z^{-N} = \frac{Z'^{-N}}{1 + Z'^{-N}} \quad (8)$$

This yields
$H(Z) = [1 - (2-a1)*Z'^{-N} - (1-a1-a2)*Z'^{-N}]^{-1}$

Figure 22:
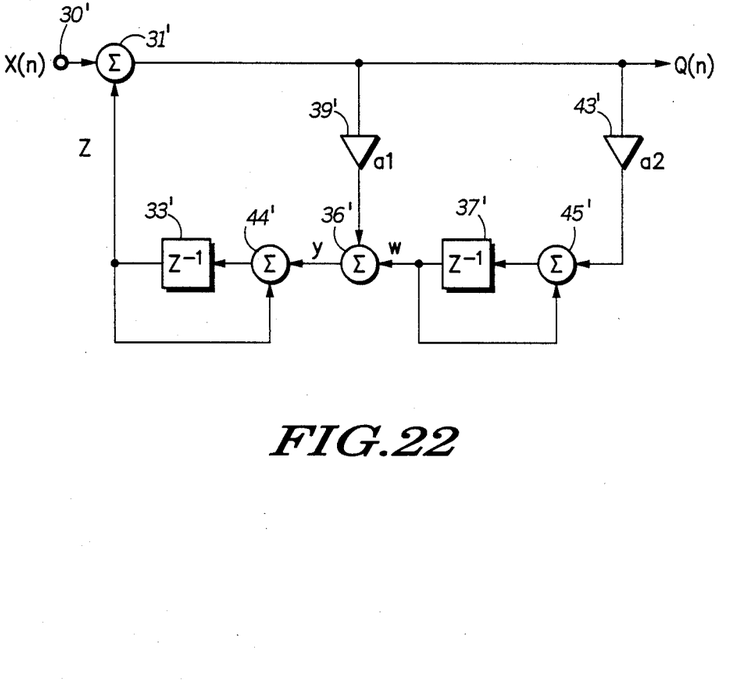
FIG. 22 is a block diagram of the pole section of FIG. 7 incorporating the Agarwal and Burrus transformation.

The Agarwal and Burrus transformation described by equation (7) is illustrated in FIG. 22. The pole section of FIG. 7 is illustrated, similar parts having similar numbers with a prime added to indicate a different embodiment. Two additional summing devices 44' and 45' are connected into the input lines of delay circuits 33' and 37', respectively. Summing device 44' receives the output signal from delay circuit 33' and sums it with the output of summing device 36' before supplying the sum signal to the input of delay circuit 33'. Similarly, summing device 45' receives the output signal from delay circuit 37' and sums it with the output of multiplier 43' before supplying it to the input of delay circuit 37'.

Thus, a new and improved systolic IIR decimation filter is illustrated and disclosed. The new filter is capable of handling signals from high speed A/D converters as well as high decimation factors. Also, the structures are substantially simplified because at least some of the full precision multiply steps are decomposed into digital shifts and additions that are fast, simple and require less structure. At least some of the components of the pole section are time shared to provide a zero section during times when redundant information would normally be processed in the pole section. Further, because of the above described improvements and simplifications it is possible to use a systolic IIR decimation filter, which allows the generation of complex pole pairs that shape the frequency response of the filter to a desired configuration.

While I have shown and described specific embodiments of the present invention, further modifications and improvements will occur to those skilled in the art. I desire it to be understood, therefore, that this invention is not limited to the particular forms shown and I intend in the appended claims to cover all modifications which do not depart from the spirit and scope of this invention.

I claim:

1. A systolic inifinite impulse response (IIR) decimation filter having an input terminal for receiving an oversampled input signal which includes redundant information, said oversampled input signal having a bandwidth substantially larger than a bandwidth of an input signal, the filter comprising:

a pole section defining at least first and second coefficients and coupled to the input terminal, the pole section multiplying the first and second coefficients by the received oversampled input signal to generate complex pole pairs positioned to shape the filter's output, at least one of the first and second coefficients and the multiplication of the received sampled input signal thereby, being decomposed into a substantially equivalent plurality of digital shifts of the sampled input signal and an addition of the plurality of shifts, said pole section also providing partially filtered output data; and a zero section formed from at least portions of said pole section and coupled to receive input signals from said pole section during the time that the redundant information is present in the pole section, said zero section providing a plurality of coefficients for multiplying with the partially filtered output data from said pole section to create zeros to compensate for unwanted poles produced by delays in said pole section caused by the decomposition of at least one of the first and second coefficients.

2. A systolic IIR decimation filter as claimed in claim 1 wherein the at least one of the first and second coefficients is decomposed in accordance with modified Booth's algorithm.

3. A systolic IIr decimation filter as claimed in claim 1 wherein the first and second coefficients, defined in terms of Z transforms having an origin in a Z plane, are redefined in accordance with Agarwal and Burris transforms to shift the origin in the Z plane.

4. A method of systolicly filtering an oversampled output signal provided by an oversampling analog-to-digital (A/D) converter, comprising the steps of:

selecting a plurality of first coefficients which, when multiplied by the oversampled output signal, will generate complex pole pairs that provide a predetermined shaping of the A/D converter output signal;

decomposing at least one of the selected plurality of first coefficients into a substantially equivalent plurality of digital shifts of the A/D converter's output signal and adding the plurality of digital shifts;

multiplying the A/D converter's output signal and the selected first coefficients systolicly by delaying the A/D converter's output signal and multiplied signals between shifts sufficiently to allow a continuous input of the A/D converter output signal, unwanted pole pairs being generated by the delaying of the A/D converter output signal and multiplied signals during multiplying;

selecting a plurality of second coefficients which, when multiplied by selected samples of the A/D converter output signal and multiplied signals, will generate zeros that effectively cancel the unwanted pole pairs; and systolicly multiplying the plurality of second coefficients and the selected samples of the A/D converter output signal and multiplied signals during times that redundant information in the A/D converter output signal and the multiplied signals is present.

5. A method of systolicly filtering as set forth in claim 4 wherein redundant information in the A/D converter output signal is decimated by switching the A/D converter output signal and multiplied signals between the steps of multiplying by the first coefficients and multiplying by the second coefficients to substantially reduce redundant information in each of the multiplying steps.

6. A method of systolicly filtering as set forth in claim 5 wherein the step of multiplying the A/D converter output signal and the selected first coefficients includes utilizing apparatus to provide the shifts, addition and delays and the step of systolicly multiplying the plurality of second coefficients and the selected ones of the A/D converter output signal and multiplied signals includes time sharing at least portions of the apparatus.

7. A method of systolicly filtering as set forth in claim 4 wherein the step of decomposing includes utilizing Booth's algorithm and variations of Booth's algorithm which allow groupings of multiplier bits of two or greater.

8. A method of systolicly filtering as set forth in claim 4 wherein the first coefficients are defined in terms of Z transforms having an origin in a Z plane, and the step of selecting a plurality of first coefficients includes utilizing Agarwal and Burrus transforms to shift the origin in the Z plane.

9. A method of constructing an Inifinite Impulse Response (IIR) decimation filter having an input terminal for receiving an input signal from an oversampled analog-to-digital (A/D) converter and the like which includes redundant information, comprising the steps of:

deriving an apparatus for performing multiplies, additions and delays generally in the form $$H(Z) = \frac{b0 + b1D + b2D2}{1 + a1D + a2D2}$$

where:
$D = Z^{-1}$ = one delay,
$D2$ = two delays;

selecting coefficients a1 and a2 to generate complex pole pairs that provide a predetermined shaping of the input signal from the converter;

decomposing, in accordance with a predetermined algorithm, at least one of a1D and a2D2 in the derived apparatus into a substantially equivalent plurality of digital shifts and addition of the plurality of digital shifts by providing a second apparatus including the digital shifts, addition and delays required for systolic operation, the additional required delays generating unwanted pole pairs; and selecting coefficients b0, b1 and b2 to generate zeros that substantially cance the unwanted pole pairs.

10. A method of constructing an IIR decimator filter as claimed in claim 9 wherein the step of deriving a second apparatus includes time sharing at least portions of the derived apparatus producing the denominator, 1 + a1D + a2D2, during times that redundant information is present and utilizing the time shared portions to produce the numerator, b0 + b1D + b2D2.

11. A method of constructing an IIR decimator filter as claimed in claim 9 wherein the step of selecting coefficients a1 and a2 includes substituting $$Z^{-N} = Z^{-N}/(1 + Z^{-N})$$

where N equals any positive integer, into the denominator of the H(Z) transform.

* * * * *